(12) United States Patent
You et al.

(10) Patent No.: US 11,329,153 B2
(45) Date of Patent: May 10, 2022

(54) METHOD FOR MANUFACTURING LATERALLY DIFFUSED METAL OXIDE SEMICONDUCTOR DEVICE AND SEMICONDUCTOR DEVICE

(71) Applicant: SILERGY SEMICONDUCTOR TECHNOLOGY (HANGZHOU) LTD, Zhejiang (CN)

(72) Inventors: Budong You, Zhejiang (CN); Meng Wang, Zhejiang (CN); Hui Yu, Zhejiang (CN); Yicheng Du, Zhejiang (CN); Chuan Peng, Zhejiang (CN)

(73) Assignee: SILERGY SEMICONDUCTOR TECHNOLOGY (HANGZHOU) LTD, Hangzhou (CN)

( * ) Notice: Subject to any disclaimer, the term of this patent is extended or adjusted under 35 U.S.C. 154(b) by 23 days.

(21) Appl. No.: 16/415,057

(22) Filed: May 17, 2019

(65) Prior Publication Data
US 2019/0363187 A1    Nov. 28, 2019

(30) Foreign Application Priority Data
May 25, 2018    (CN) .......................... 201810515878.7

(51) Int. Cl.
| | |
|---|---|
| *H01L 29/78* | (2006.01) |
| *H01L 21/765* | (2006.01) |
| *H01L 29/10* | (2006.01) |
| *H01L 29/40* | (2006.01) |
| *H01L 29/66* | (2006.01) |

(52) U.S. Cl.
CPC ........ *H01L 29/7816* (2013.01); *H01L 21/765* (2013.01); *H01L 29/1095* (2013.01); *H01L 29/402* (2013.01); *H01L 29/66492* (2013.01); *H01L 29/66537* (2013.01); *H01L 29/66681* (2013.01); *H01L 29/7835* (2013.01)

(58) Field of Classification Search
CPC ......... H01L 29/7835; H01L 21/823493; H01L 29/7816; H01L 21/765; H01L 29/1095; H01L 29/402; H01L 29/66492; H01L 29/66537; H01L 29/66681
See application file for complete search history.

(56) References Cited

U.S. PATENT DOCUMENTS

| | | | | | |
|---|---|---|---|---|---|
| 7,602,037 | B2* | 10/2009 | Lin | ...................... | H01L 29/7835 257/492 |
| 7,635,621 | B2* | 12/2009 | McCormack | ....... | H01L 29/0878 257/335 |
| 9,082,846 | B2* | 7/2015 | Lu | ....................... | H01L 29/0649 |
| 2004/0065935 | A1* | 4/2004 | Lee | ..................... | H01L 29/7816 257/492 |

(Continued)

*Primary Examiner* — Latanya N Crawford Eason
(74) *Attorney, Agent, or Firm* — Harness, Dickey & Pierce, P.L.C.

(57) ABSTRACT

A method for manufacturing a laterally diffused metal oxide semiconductor device and a semiconductor device are provided. A body region is formed before forming a gate dielectric layer and a gate conductor, thereby reducing a channel length of the semiconductor device, thus reducing the on-resistance. In addition, a drift region serves as both a region withstanding a high voltage and a diffusion suppression region for suppressing lateral diffusion of the body region, thereby further reducing the channel length of the semiconductor device, thus manufacturing a short-channel semiconductor device.

16 Claims, 5 Drawing Sheets

(56) References Cited

U.S. PATENT DOCUMENTS

| | | | |
|---|---|---|---|
| 2007/0246771 A1* | 10/2007 | McCormack | H01L 29/7816 257/335 |
| 2007/0264785 A1* | 11/2007 | Choi | H01L 29/1095 438/297 |
| 2008/0128818 A1* | 6/2008 | Chen | H01L 29/7835 257/362 |
| 2008/0237703 A1* | 10/2008 | Lin | H01L 29/66689 257/336 |
| 2009/0140343 A1* | 6/2009 | Feilchenfeld | H01L 29/66704 257/367 |
| 2009/0321852 A1* | 12/2009 | Yoneda | H01L 29/0847 257/409 |
| 2014/0320174 A1* | 10/2014 | Lu | H01L 29/402 327/109 |
| 2016/0141413 A1* | 5/2016 | Noh | H01L 29/4238 257/337 |
| 2017/0278963 A1* | 9/2017 | Liu | H01L 21/76897 |
| 2017/0301668 A1* | 10/2017 | Kim | H01L 21/761 |

* cited by examiner

METHOD FOR MANUFACTURING LATERALLY DIFFUSED METAL OXIDE SEMICONDUCTOR DEVICE AND SEMICONDUCTOR DEVICE

The present application claims priority to Chinese Patent Application No. 201810515878.7, titled "METHOD FOR MANUFACTURING LATERALLY DIFFUSED METAL OXIDE SEMICONDUCTOR DEVICE AND SEMICONDUCTOR DEVICE", filed on May 25, 2018 with the Chinese Patent Office, which is incorporated herein by reference in its entirety.

FIELD

The present disclosure relates to the technical field of semiconductors, and in particular to a method for manufacturing a laterally diffused metal oxide semiconductor device and a semiconductor device.

BACKGROUND

As shown in FIG. 1, a conventional laterally diffused metal oxide semiconductor device 100 includes a P-type substrate PSUB, a high voltage N-type well region HVNW in the P-type substrate PSUB, a P-type body region Pbody and an N-type drift region N-drift in the high voltage N-type well region HVNW. Where a source region N+ and a drain region N+ are respectively formed in the P-type body region Pbody and the N-type drift region N-drift. A body contact region P+ is also formed in the P-type body region Pbody and is arranged in contact with the source region N+. A gate dielectric layer (not labeled in FIG. 1) is arranged on a surface of a semiconductor device 100 and is adjacent to the source region. A thick oxide layer Oxide between the gate dielectric layer and the drain region is arranged on a surface of semiconductor device 100. A gate conductor poly is configured to cover the gate dielectric layer and extends to the thick oxide layer Oxide.

With a conventional method for manufacturing the semiconductor device 100, the gate dielectric layer and the gate conductor poly are formed on a surface of a base layer including the semiconductor substrate PSUB and the well region HVNW at one time, then the body region Pbody is formed in the well region HVNW with a self-alignment process, finally the drift region N-drift is formed in the well region HVNW. In the semiconductor device 100 manufactured with the above method, a channel length is large due to the lateral diffusion of the body region Pbody, resulting in a large channel resistance for a low voltage application, thus limiting optimization on an on-resistance and a withstand voltage of the semiconductor device.

SUMMARY

In view of the above, a method for manufacturing a laterally diffused metal oxide semiconductor device and a semiconductor device are provided according to the present disclosure, to reduce the channel length of the semiconductor device, and optimize the on-resistance and the withstand voltage of the semiconductor device.

A method for manufacturing a laterally diffused metal oxide semiconductor device is provided according to the present disclosure, which includes:
  forming a drift region of a first doping type in a base layer;
  forming a body region of a second doping type in the base layer, where lateral diffusion of the body region toward the drift region is suppressed by the drift region; and
  forming a gate dielectric layer and a gate conductor on a first surface of the base layer after forming the body region.

In an embodiment, the body region is arranged in contact with the drift region, or at least a part of the body region is arranged in the drift region.

In an embodiment, the drift region extends from one side at a drain portion of the laterally diffused metal oxide semiconductor device to one side at a source portion of the laterally diffused metal oxide semiconductor device. A dopant of the second doping type is implanted into the drift region on the side at the source portion of the laterally diffused metal oxide semiconductor device to form the body region in the drift region.

In an embodiment, the method further includes: forming a well region of the first doping type in a semiconductor substrate. The base layer includes the semiconductor substrate and the well region, and the drift region and the body region are formed in the well region.

In an embodiment, the method further includes: forming a field oxide layer on the first surface of the base layer.

In an embodiment, the method further includes: forming a voltage withstanding layer on the first surface of the base layer. The voltage withstanding layer is arranged adjacent to the gate dielectric layer, and at least a part of the voltage withstanding layer is arranged on the drift region.

In an embodiment, the forming the gate conductor includes:
  forming a conductor layer on the first surface of the base layer; and
  etching the conductor layer to form the gate conductor, where at least a part of the gate conductor is arranged on the gate dielectric layer.

In an embodiment, the forming the gate conductor includes:
  forming a conductor layer on the first surface of the base layer; and
  etching the conductor layer to form the gate conductor and a field conductor, wherein at least a part of the gate conductor is arranged on the gate dielectric layer, and at least a part of the field conductor is arranged on the voltage withstanding layer. The gate conductor is spatially isolated from the field conductor.

In an embodiment, the method further includes: forming a lightly doped drain region of the first doping type in a surface region of the body region; and forming a sidewall of the gate conductor.

In an embodiment, the method further includes:
  forming a lightly doped drain region of the first doping type in a surface region of the body region and the drain portion; and
  forming a sidewall of the gate conductor;
  forming a drain region of the first doping type in the drift region and forming a source region of the first doping type in the body region; and
  forming a body contact region of the second doping type in the body region.

In an embodiment, the second doping type is a P-type, and the body region is formed by implanting a dopant containing indium into the base layer.

A semiconductor device is further provided according to the present disclosure. The semiconductor device is a laterally diffused metal oxide semiconductor device. The semiconductor device includes a base layer, a drift region of the first doping type arranged in the base layer, and a body region of the second doping type arranged in the base layer. There is a predetermined position relationship between the drift region and the body region, such that lateral diffusion of the body region toward the drift region is suppressed by the drift region.

In an embodiment, the semiconductor device further includes a gate dielectric layer and a gate conductor arranged on a first surface of the base layer. A part of the gate dielectric layer is arranged on a surface of the body region, and another part of the gate dielectric layer is arranged on a surface of the base layer.

In an embodiment, the semiconductor device further includes a source region of the first doping type arranged in the body region. The source region is arranged adjacent to the gate dielectric layer.

In an embodiment, the semiconductor device further includes: a drain region of the first doping type arranged in the drift region; and a voltage withstanding layer. The voltage withstanding layer is arranged on the first surface of the base layer and between the gate dielectric layer and the drain region, and at least a part of the voltage withstanding layer is arranged on the drift region.

In an embodiment, the body region is arranged in contact with the drift region, or at least a part of the body region is arranged in the drift region.

In an embodiment, the drift region is configured to extend from one side at a drain portion of the laterally diffused metal oxide semiconductor device to one side at a source portion of the laterally diffused metal oxide semiconductor device.

In an embodiment, the body region is arranged in the drift region on the side at the source portion of the laterally diffused metal oxide semiconductor device.

In an embodiment, the base layer includes a semiconductor substrate and a well region of the first doping type arranged on the semiconductor substrate. The body region and the drift region are arranged in the well region.

In an embodiment, the semiconductor device further includes a field conductor. At least a part of the field conductor is arranged on the voltage withstanding layer, and the field conductor is spatially isolated from the gate conductor.

In an embodiment, the second doping type is a P-type, and a dopant in the body region contains indium.

It can be seen from the above that, in a semiconductor device manufactured with a method for manufacturing a laterally diffused metal oxide semiconductor device according to the present disclosure, the body region is formed before forming the gate dielectric layer and the gate conductor, thereby reducing the channel length of the semiconductor device, thus reducing the on-resistance. In addition, the drift region serves as both a region withstanding a high voltage and a diffusion suppression region for suppressing the lateral diffusion of the body region, thereby further reducing the channel length of the semiconductor device, thus manufacturing a short-channel semiconductor device.

BRIEF DESCRIPTION OF THE DRAWINGS

The above and other objects, features and advantages of the present disclosure become more apparent from the description described in conjunction with the drawings hereinafter. In the drawings.

DETAILED DESCRIPTION OF EMBODIMENTS

Figure 1:
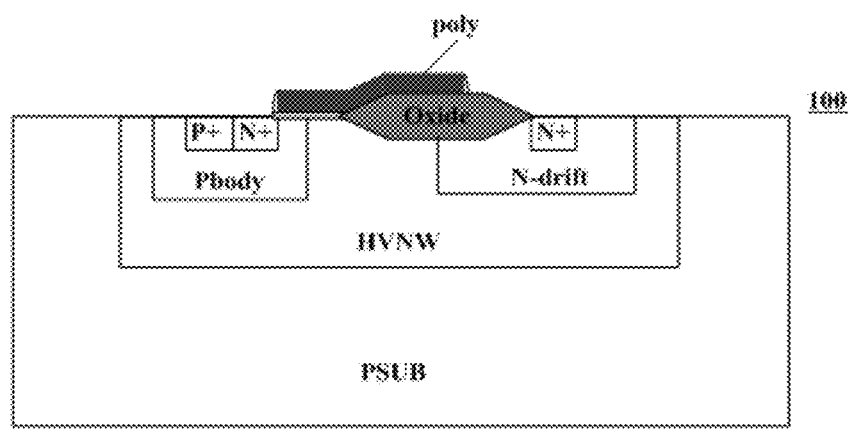
FIG. 1 is a cross-sectional diagram of a conventional laterally diffused metal oxide semiconductor device.

The present disclosure is described in detail with reference to the drawings. In the drawings, the same component is indicated by the similar reference numeral. For the sake of clarity, the various parts in the figures are not drawn to scale. Moreover, some well-known parts may not be shown. For the sake of brevity, a structure obtained after several steps may be described in one figure. Many specific details of the present disclosure are described below, such as a structure, a material, a dimension of each component, a treatment process and a technique in the present disclosure, so as to understand the disclosure more clearly. However, as can be understood by those skilled in the art, the present disclosure may be realized without these specific details.

FIGS. 2a to 2h are cross-sectional diagrams each showing a structure formed in a formation step of a method for manufacturing a laterally diffused metal oxide semiconductor device according to the present disclosure.

Figure 2A:
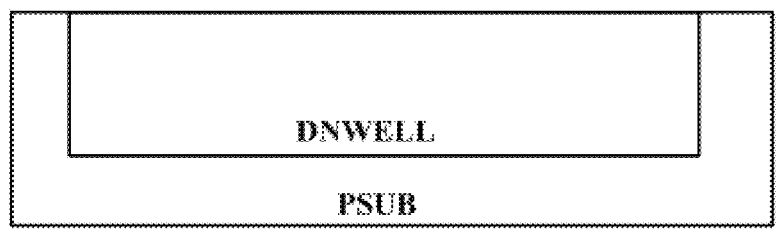
FIGS. 2a to 2h are cross-sectional diagrams each showing a structure formed in a formation step of a method for manufacturing a laterally diffused metal oxide semiconductor device according to the present disclosure.

In step 1, as shown in FIG. 2a, an N-type dopant is implanted into a semiconductor substrate, for example, a P-type doped substrate PSUB, to form an N-type well region DNWELL withstanding a high voltage in the P-type doped substrate PSUB.

In addition, after the well region DNWELL is formed, a field oxide layer (not labeled in FIG. 2a) may be formed on a surface of the base layer including the substrate PSUB and the well region DNWELL. For example, the field oxide layer is formed through a local oxidation of silicon (LOCOS) process.

Figure 2B:
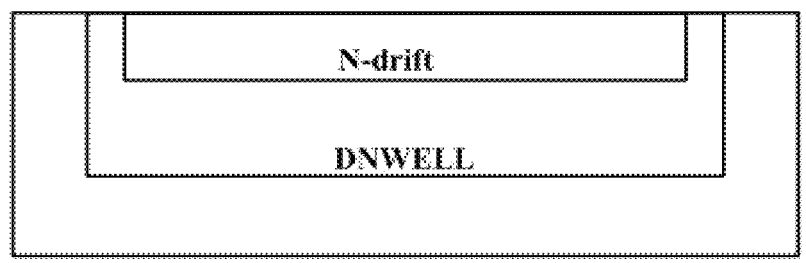

In step 2, as shown in FIG. 2b, an N-type dopant is implanted into the base layer including the substrate PSUB and the well region DNWELL, to form an N-type drift region N-drift. The drift region N-drift extends from a drain portion of the laterally diffused metal oxide semiconductor device to a source portion of the laterally diffused metal oxide semiconductor. The drift region N-drift mainly serves as a region withstanding a high voltage of the laterally diffused metal oxide semiconductor device.

Preferably, the drift region N-drift may be configured to extend to the source portion of the laterally diffused metal oxide semiconductor device, that is, a part of the drift region N-drift is arranged in the source portion of the laterally diffused metal oxide semiconductor device. The drain portion refers to a region where a drain region is arranged, the drain region is located in the drain portion, and the source portion refers to a region where a source region is arranged, the source region is located in the source portion. The drift region N-drift is arranged in the well region DNWELL of the base layer, and the drift region N-drift may cover an entire surface of the well region DNWELL. Therefore, it is unnecessary to remove a first mask after an N-type dopant with a first concentration is implanted using the first mask to form the well region DNWELL. Instead, the first mask is also used to implant an N-type dopant with a second concentration to form the drift region, such that the well region DNWELL and the drift region N-drift may be formed using the same mask, thereby performing one less photolithography process, thus the manufacturing cost of the semiconductor device is reduced.

In step 3, a voltage withstanding layer is formed on the first surface of the base layer. At least a part of the voltage withstanding layer is arranged on the drift region N-drift, and the voltage withstanding layer is also arranged between the gate dielectric layer and the drain region of the laterally diffused metal oxide semiconductor device.

Figure 2C:
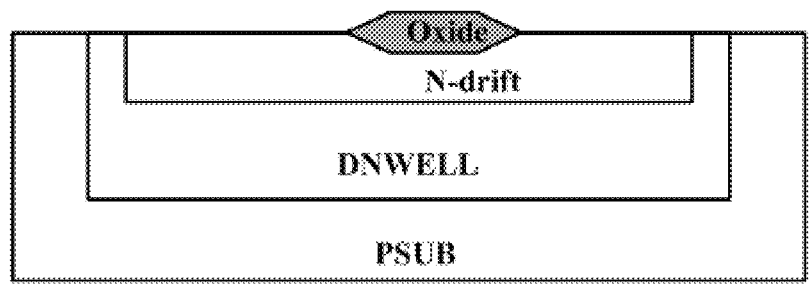

In the present embodiment, as shown in FIG. 2c, the voltage withstanding layer is an oxide layer Oxide. A thickness of the oxide layer Oxide is generally greater than a thickness of the gate dielectric layer of the laterally diffused metal oxide semiconductor device, and the oxide layer Oxide may be in a bird's beak-shape. In other embodiments, the voltage withstanding layer may also be other dielectric layers, and may also be a shallow trench isolated layer.

In step 4, a P-type body region Pbody is formed in the well region DWELL of the base layer. The P-type body region Pbody is arranged in the source portion of the laterally diffused metal oxide semiconductor device. For example, the P-type body region Pbody may be formed by implanting a dopant containing indium, to reduce lateral diffusion of the P-type body region Pbody. Further, since the drift region N-drift is configured to extend from one side at the drain portion of the laterally diffused metal oxide semiconductor device to one side at the source portion of the laterally diffused metal oxide semiconductor device, the lateral diffusion of the P-type body region Pbody toward the drift region N-drift can be hindered or suppressed by the drift region N-drift. In this way, a lateral diffusion distance of a P-type impurity in the P-type body region Pbody toward the drift region N-drift can be effectively reduced under the suppression of the drift region N-drift. That is, the formed P-type body region Pbody has a lateral dimension approximately the same as an opening dimension of the mask used in forming the P-type body region Pbody. In a case that the P-type dopant is implanted to form the body region Pbody, a threshold voltage of the laterally diffused metal oxide semiconductor device may be adjusted by changing the doping concentration of the P-type dopant.

Figure 2D:
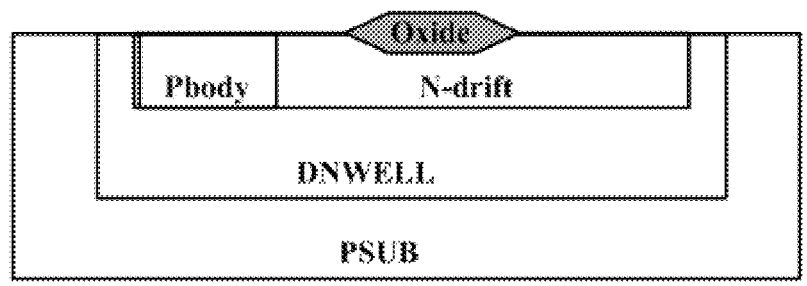

In the present embodiment, as shown in FIG. 2d, since the drift region N-drift extends to one side at the source portion of the laterally diffused metal oxide semiconductor device, a P-type dopant may be directly implanted into the drift region N-drift, such that a doping type of the implanted region changes from an N-type to a P-type, to form a P-type body region Pbody in the source portion of the laterally diffused metal oxide semiconductor device. That is, the P-type body region Pbody is arranged in the drift region N-drift, and the body region Pbody is surrounded by the drift region N-drift at one side close to the gate dielectric layer. Therefore, the lateral diffusion of the body region Pbody may be suppressed by appropriately adjusting a doping concentration of the drift region N-drift. In other embodiments, a part of the P-type body region Pbody may be arranged in the drift region N-drift, or the P-type body region Pbody is arranged in contact with the drift region N-drift. In order to suppress the lateral diffusion of the body region Pbody to the drift region N-drift, a large doping concentration of the drift region N-drift is required for a large distance between the drift region N-drift and the P-type body region Pbody.

In step 5, after the P-type body region Pbody is formed, a gate dielectric layer is formed on the first surface of the base layer and a gate conductor is formed on the gate dielectric layer. A part of the gate dielectric layer is arranged on the P-type body region Pbody, and another part of the gate dielectric layer is arranged on the well region DNWELL and/or the drift region N-drift. In addition, one side of the gate dielectric layer is arranged adjacent to a subsequently formed source region, and the other side is adjacent to the voltage withstanding layer. At least a part of the gate conductor is arranged on the gate dielectric layer. In an embodiment, the gate conductor may extend from the gate dielectric layer to the voltage withstanding layer.

Figure 2E:
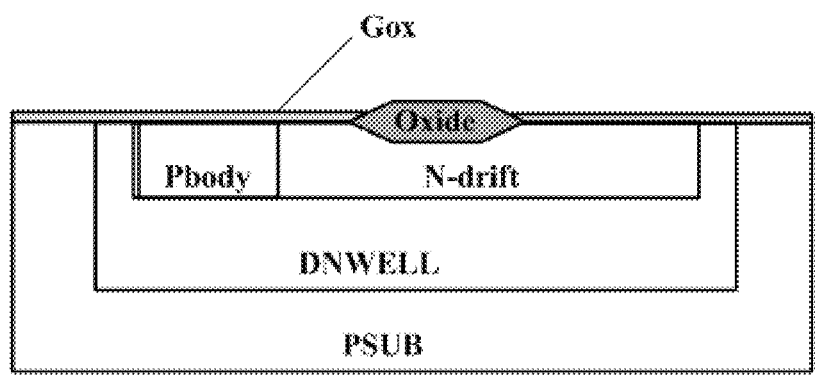
Figure 2F:
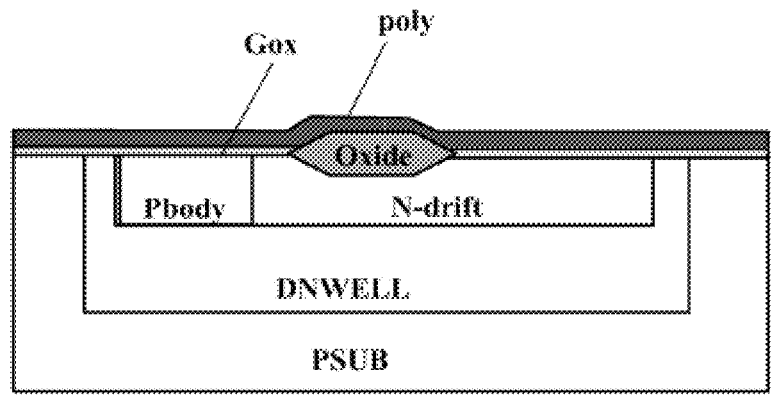
Figure 2G:
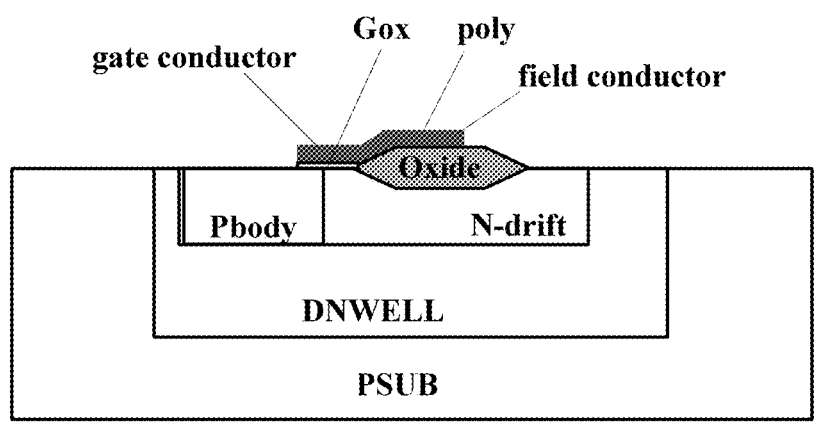

The specific steps of forming the gate dielectric layer and the gate conductor are as shown in FIGS. 2e-2g. Firstly, an oxide layer Gox is formed on the first surface of the base layer. A conductor layer, for example, a polysilicon layer Poly, is deposited on the oxide layer Gox. The polysilicon layer Poly is etched. The etching process may be performed until exposing the gate oxide layer Gox or until exposing the first surface of the base layer (that is, the gate oxide layer Gox other than the gate portion is removed from the base layer). In this embodiment, the etching process is performed until exposing the first surface of the base layer, as shown in FIG. 2g. After the etching process is performed, the polysilicon layer Poly serves as the gate conductor, the oxide layer Gox under the gate conductor serves as a gate dielectric layer.

A field conductor is also formed on the voltage withstanding layer when the conductor layer is etched to form the gate conductor. Where, the gate conductor and the field conductor are integrated, or the gate conductor is spatially isolated from the field conductor. That is, a part of the etched conductor layer serves as the gate conductor, and another part of the etched conductor layer serves as the field conductor. In this embodiment, since the etching process is performed until exposing the first surface of the base layer in etching the conductor layer, a thin oxide layer may be grown on the surface of the base layer before subsequent implantation is performed to form the source region and the drain region.

In addition, after the gate dielectric layer and the gate conductor are formed, an N-type dopant may be implanted into a surface region of the body region Pbody and drain portion, to form an N-type lightly doped drain region NLDD (not labeled in the figures), and form a sidewall(not labeled in the figures) of the gate conductor. The sidewall may be made of an oxide, for example, $SiO_2$.

Figure 2H:
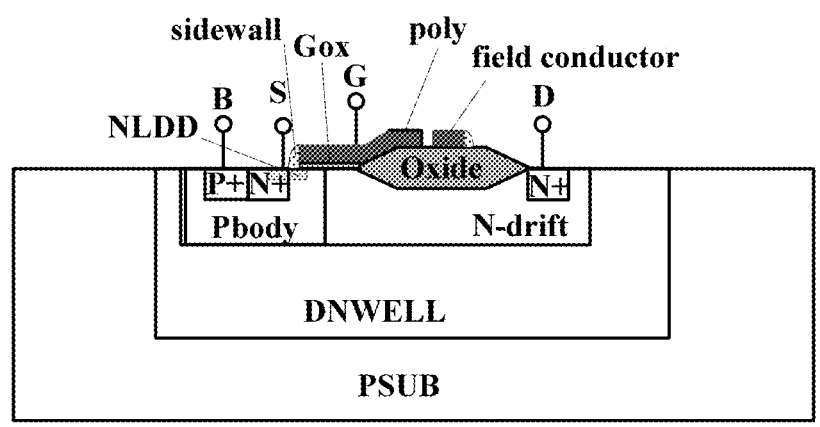

In step 6, as shown in FIG. 2h, an N-type dopant is implanted into the drift region N-drift and the body region Pbody, to respectively form an N-type drain region N+ and a source region N+. A P-type dopant is implanted into the body region Pbody to form a P-type body contact region P+. The body contact region P+ is arranged adjacent to the source region N+.

After the source region and the drain region are formed, it is required to form electrodes of the laterally diffused metal oxide semiconductor device, such as a source electrode S electrically connected to the source region N+, a drain electrode D electrically connected to the drain region N+, a gate conductor G electrically connected to the gate conductor, and a substrate electrode B electrically connected to the body contact region P+. A structure of each electrode is not shown in FIG. 2, and is only indicated by a connecting terminal. In addition, in a case that the field conductor is arranged on the voltage withstanding layer, the forming the electrodes includes forming a field plate electrode electrically connected to the field conductor. The field plate electrode and the gate electrode are supplied with different potentials, and the field plate electrode and the source electrode are supplied with the same potential.

Other embodiments of the method for manufacturing a laterally diffused metal oxide semiconductor device according to the present disclosure may not necessarily include all the steps described above, and are not limited to including just the above steps. The sequence of the steps is not limited to the above, which may be changed in other embodiments. The doping type of each region is not limited to the above. In addition, in embodiments of the method for manufacturing a laterally diffused metal oxide semiconductor device according to the present disclosure, the drift region, the well region and the lightly doped drain region are of the first doping type and are formed by doping a dopant of the first doping type, and the substrate, the body region and the body contact region are of the second doping type and are formed by doping a dopant of the second doping type. The first doping type is one of a P type and an N type, and the second doping type is the other one of a P type and an N type.

In addition, a semiconductor device formed by the manufacturing method of the present disclosure is further provided according to the present disclosure, and a schematic structural diagram of the semiconductor device is as shown in FIG. 2h. The laterally diffused metal oxide semiconductor device mainly includes a base layer, a drift region of a first doping type arranged in the base layer, and a body region of a second doping type arranged in the base layer. There is a predetermined positional relationship between the drift region and the body region, such that lateral diffusion of the body region toward the drift region is suppressed by the drift region. The laterally diffused metal oxide semiconductor device may further include a gate dielectric layer arranged on the first surface of the base layer, a gate conductor at least partially arranged on the gate dielectric layer, a source region of a first doping type arranged in the body region, a drain region of a first doping type arranged in the drift region, a voltage withstanding layer arranged on the first surface of the base layer and between the gate dielectric layer and the drain region, and a field conductor at least partially arranged on the voltage withstanding layer. Where a part of the gate dielectric layer is arranged on a surface of the body region, and another part of the gate dielectric layer is arranged on the surface of the base layer. The source region is arranged adjacent to the gate dielectric layer. At least a part of the voltage withstanding layer is arranged on the drift region. The field conductor is spatially isolated from the gate conductor. The laterally diffused metal oxide semiconductor device may further include a body contact region of the second doping type arranged in the body region. The body region is arranged in contact with the drift region or at least a part of the body region is arranged in the drift region. Specifically, the drift region extends from the drain portion of the laterally diffused metal oxide semiconductor device to the source portion of the laterally diffused metal oxide semiconductor device, and the body region is arranged in the drift region on one side at the source portion of the laterally diffused metal oxide semiconductor device.

In addition, the base layer includes a semiconductor substrate and a well region of the first doping type. The well region is arranged in the semiconductor substrate, and the body region and the drift region are arranged in the well region. In the semiconductor device according to an embodiment of the present disclosure, the first doping type is the N-type, and the second doping type is the P-type, and the dopant in the body region contains indium. In other embodiments, the second doping type may be the N-type, and the first doping type is the P-type.

It can be seen from the above that, in the semiconductor device formed by the manufacturing method according to the present disclosure, the body region is formed before forming the gate dielectric layer and the gate conductor, thereby reducing the channel length of the semiconductor device, thus reducing the on-resistance. In addition, the drift region serves as both the region withstanding a high voltage and the diffusion suppression region for suppressing the lateral diffusion of the body region, thereby further reducing the channel length of the semiconductor device, thus manufacturing a short-channel semiconductor device.

The embodiments according to the present disclosure are described as above, which do not describe all the details in detail, and are not intended to limit the present disclosure to the specific embodiments. Obviously, many modifications and variations maybe made based on the above description. The embodiments are selected and described in the present specification in detail, so as to explain the principles and practical applications of the present disclosure, so that those skilled in the art can make good use of the present disclosure and make modifications based on the present disclosure. The present disclosure is only limited by the claims and the full scope and equivalents thereof.

The invention claimed is:

1. A method for manufacturing a laterally diffused metal oxide semiconductor device, comprising:
    forming a drift region of a first doping type in a base layer;
    forming a body region of a second doping type in the base layer, wherein lateral diffusion of the body region toward the drift region is suppressed by the drift region, wherein the body region is all arranged in the drift region; and
    after forming the body region, forming a gate dielectric layer and a gate conductor on a first surface of the base layer after forming the body region,
    wherein before forming a drift region of a first doping type in a base layer, the method further comprises forming a field oxide layer on a surface of the base layer,
    the method further comprises: forming a voltage withstanding layer on the first surface of the base layer before forming the body region and after forming the drift region, wherein the voltage withstanding layer is arranged adjacent to the gate dielectric layer, and at least a part of the voltage withstanding layer is arranged on the drift region,
    wherein before forming the drift region of the first doping type in the base layer and the field oxide layer on the surface of the base layer, the method further comprises forming an N-type well region, the drift region is arranged in the well region of the base layer, and the well region and the drift region are formed using the same mask.

2. The method according to claim 1, wherein the body region is arranged in contact with the drift region, or at least a part of the body region is arranged in the drift region.

3. The method according to claim 2, wherein the drift region extends from one side at a drain portion of the laterally diffused metal oxide semiconductor device to one side at a source portion of the laterally diffused metal oxide semiconductor device, and
    a dopant of the second doping type is implanted into the drift region on the side at the source portion of the laterally diffused metal oxide semiconductor device to form the body region in the drift region.

4. The method according to claim 1, further comprising: forming a well region of the first doping type in a semiconductor substrate, wherein the base layer comprises the semiconductor substrate and the well region, and the drift region and the body region are formed in the well region.

5. The method according to claim 1, wherein forming the gate conductor comprises:

forming a conductor layer on the first surface of the base layer; and etching the conductor layer to form the gate conductor, wherein at least a part of the gate conductor is arranged on the gate dielectric layer.

6. The method according to claim 1, further comprising:

forming a lightly doped drain region of the first doping type in a surface region of the body region and the drain portion;

forming a sidewall of the gate conductor;

forming a drain region of the first doping type in the drift region and forming a source region of the first doping type in the body region; and forming a body contact region of the second doping type in the body region.

7. The method according to claim 1, wherein the second doping type is a P-type, and the body region is formed by implanting a dopant containing indium into the base layer.

8. A semiconductor device, wherein the semiconductor device is a laterally diffused metal oxide semiconductor device and comprises:

a base layer;

an N-type well region;

a drift region of a first doping type arranged in the base layer, wherein the N-type well region is formed before the drift region, the drift region is arranged in the well region of the base layer, and the well region and the drift region are formed using the same mask; and a body region of a second doping type arranged in the base layer, wherein there is a predetermined positional relationship between the drift region and the body region such that lateral diffusion of the body region toward the drift region is suppressed by the drift region, wherein the body region is all arranged in the drift region, wherein the semiconductor device further comprises a field oxide layer formed on a surface of the base layer, wherein the field oxide layer is formed before the drift region of the first doping type arranged in the base layer; and a gate dielectric layer and a gate conductor arranged on a first surface of the base layer, wherein the gate dielectric layer and the gate conductor are formed on the first surface of the base layer after forming the body region, a part of the gate dielectric layer is arranged on a surface of the body region, and another part of the gate dielectric layer is arranged on the first surface of the base layer, the semiconductor device further comprises:

a drain region of the first doping type arranged in the drift region; and a voltage withstanding layer, wherein the voltage withstanding layer is arranged on the first surface of the base layer and between the gate dielectric layer and the drain region, and at least a part of the voltage withstanding layer is arranged on the drift region, wherein the voltage withstanding layer is formed before the forming of the body region.

9. The semiconductor device according to claim 8, further comprising: a source region of the first doping type arranged in the body region, wherein the source region is arranged adjacent to the gate dielectric layer.

10. The semiconductor device according to claim 8, wherein the body region is arranged in contact with the drift region, or at least a part of the body region is arranged in the drift region.

11. The semiconductor device according to claim 10, wherein the drift region is configured to extend from one side at a drain portion of the laterally diffused metal oxide semiconductor device to one side at a source portion of the laterally diffused metal oxide semiconductor device.

12. The semiconductor device according to claim 11, wherein the body region is arranged in the drift region on the side at the source portion of the laterally diffused metal oxide semiconductor device.

13. The semiconductor device according to claim 11, wherein the base layer comprises a semiconductor substrate and a well region of the first doping type, the well region is arranged in the semiconductor substrate, and the body region and the drift region are arranged in the well region.

14. The semiconductor device according to claim 8, wherein the second doping type is a P-type, and a dopant in the body region contains indium.

15. The method according to claim 1, wherein forming the gate conductor comprises:

forming a conductor layer on the first surface of the base layer; and etching the conductor layer to form the gate conductor and a field conductor, wherein at least a part of the gate conductor is arranged on the gate dielectric layer, and at least a part of the field conductor is arranged on the voltage withstanding layer, wherein the gate conductor is spatially isolated from the field conductor.

16. The semiconductor device according to claim 8, wherein the semiconductor device further comprises:

a field conductor, wherein at least a part of the field conductor is arranged on the voltage withstanding layer, and the field conductor is spatially isolated from the gate conductor.

* * * * *